United States Patent
Fukumizu et al.

(10) Patent No.: US 9,219,175 B2
(45) Date of Patent: Dec. 22, 2015

(54) IMAGING DEVICE AND METHOD FOR MANUFACTURING SAME

(71) Applicant: Kabushiki Kaisha Toshiba, Minato-ku (JP)

(72) Inventors: Hiroyuki Fukumizu, Kanagawa-ken (JP); Takaaki Minami, Oita-ken (JP); Kentaro Eda, Oita-ken (JP); Takeshi Yosho, Oita-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/201,985

(22) Filed: Mar. 10, 2014

(65) Prior Publication Data
US 2015/0001660 A1  Jan. 1, 2015

(30) Foreign Application Priority Data
Jun. 26, 2013  (JP) .................................. 2013-134280

(51) Int. Cl.
*H01L 31/0232*  (2014.01)
*H01L 31/18*  (2006.01)

(52) U.S. Cl.
CPC ............ *H01L 31/0232* (2013.01); *H01L 31/18* (2013.01)

(58) Field of Classification Search
CPC .................. H01L 27/14627; H01L 27/14603; H01L 27/14621; H01L 27/14689; H01L 27/14634
USPC ........................................ 257/432, 435, 228
See application file for complete search history.

(56) References Cited

U.S. PATENT DOCUMENTS

| | | | | |
|---|---|---|---|---|
| 2011/0156186 A1* | 6/2011 | Iida et al. | ............ | H01L 27/1464 257/432 |
| 2011/0241148 A1* | 10/2011 | Hiyama et al. | ..... | H01L 27/14623 257/435 |
| 2012/0008024 A1* | 1/2012 | Takimoto | .......... | H01L 27/14687 348/294 |
| 2012/0217602 A1* | 8/2012 | Enomoto | .......... | H01L 27/14614 257/432 |

FOREIGN PATENT DOCUMENTS

JP  2012-23207  2/2012

OTHER PUBLICATIONS

U.S. Appl. No. 14/631,002, filed Feb. 25, 2015, Fukumizu, et al.

* cited by examiner

*Primary Examiner* — Cuong Q Nguyen
*Assistant Examiner* — Nishath Yasmeen
(74) *Attorney, Agent, or Firm* — Oblon, McClelland, Maier & Neustadt, L.L.P.

(57) ABSTRACT

According to one embodiment, an imaging device includes a semiconductor layer, an electrode, first and second insulating films, and a light blocking film. The semiconductor layer has a first surface and a second surface on an opposite side to the first surface, and includes pixels configured to detect light. The electrode is provided on the first surface and is configured to control an output of the pixels. The first insulating film is provided on the second surface. The second insulating film is provided on the first insulating film and has a smaller refractive index in a visible light range than the first insulating film. One end of the light blocking film is located in the second insulating film or at a same level as a surface of the second insulating film. Another end of the light blocking film is located in the semiconductor layer.

19 Claims, 6 Drawing Sheets

IMAGING DEVICE AND METHOD FOR MANUFACTURING SAME

CROSS-REFERENCE TO RELATED APPLICATIONS

This application is based upon and claims the benefit of priority from Japanese Patent Application No. 2013-134280, filed on Jun. 26, 2013; the entire contents of which are incorporated herein by reference.

FIELD

Embodiments described herein relate generally to an imaging device and a method for manufacturing the same.

BACKGROUND

An imaging device such as a CCD (charge coupled device) and a CMOS image sensor (complementary metal oxide semiconductor image sensor) includes a plurality of pixels that perform photoelectric conversion and a circuit unit that outputs an image signal in which the outputs of the individual pixels are aggregated. There are two types of imaging devices: a front-side illumination device in which both the pixel and the circuit unit are provided on one chip surface; and a back-side illumination device in which the circuit unit is provided on the front surface side and the pixel is provided on the back surface side. Of these, the back-side illumination device allows the density of pixels to be easily increased and has high sensitivity because the circuit unit is not provided on the light receiving surface. However, in the back-side illumination device, it is likely that color mixing between adjacent pixels (crosstalk) will occur. Hence, a high performance imaging device is required in which crosstalk between pixels is suppressed.

DETAILED DESCRIPTION

Figure 1A:
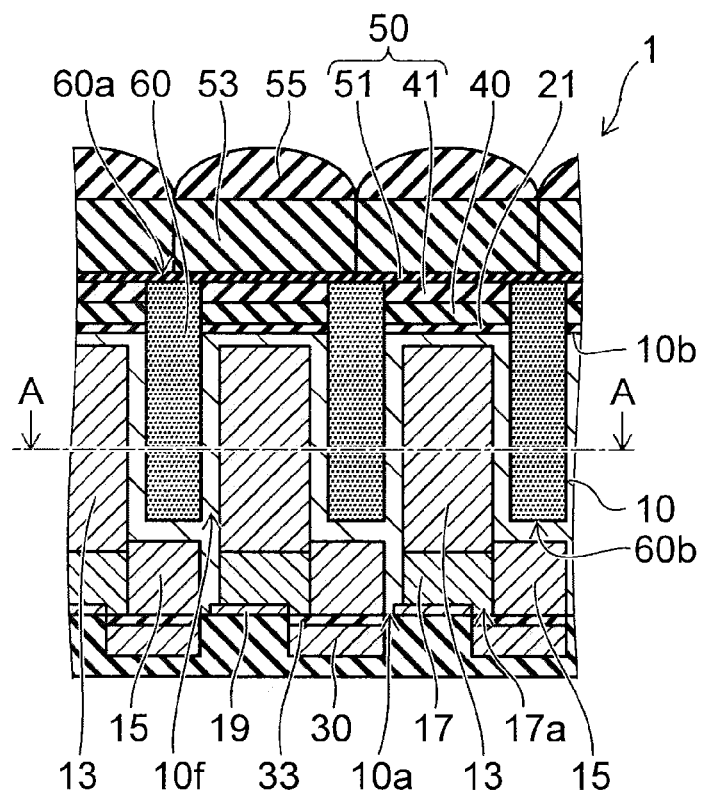
FIGS. 1A and 1B are schematic views showing an imaging device according to an embodiment.

According to one embodiment, an imaging device includes a semiconductor layer of a first conductivity type, an electrode, a first insulating film, a second insulating film, and a light blocking film. The semiconductor layer has a first surface and a second surface on an opposite side to the first surface. The semiconductor layer includes a plurality of pixels configured to detect light incident from a side of the second surface. The electrode is provided on the first surface and is configured to control an output of each of the pixels. The first insulating film is provided on the second surface. The second insulating film is provided on the first insulating film in contact with the first insulating film and has a smaller refractive index in a visible light range than the first insulating film. The light blocking film defines a boundary between adjacent ones of the pixels. One end of the light blocking film is located in the second insulating film or at a same level as a surface of the second insulating film on an opposite side to a surface in contact with the first insulating film. Another end of the light blocking film is located in the semiconductor layer.

Various embodiments will be described hereinafter with reference to the accompanying drawings. Identical components in the drawings are marked with the same reference numerals, and a detailed description thereof is omitted as appropriate and different components are described. The drawings are schematic or conceptual; and the relationships between the thickness and width of portions, the proportions of sizes among portions, etc. are not necessarily the same as the actual values thereof. Further, the dimensions and proportions may be illustrated differently among drawings, even for identical portions.

Figure 1B:
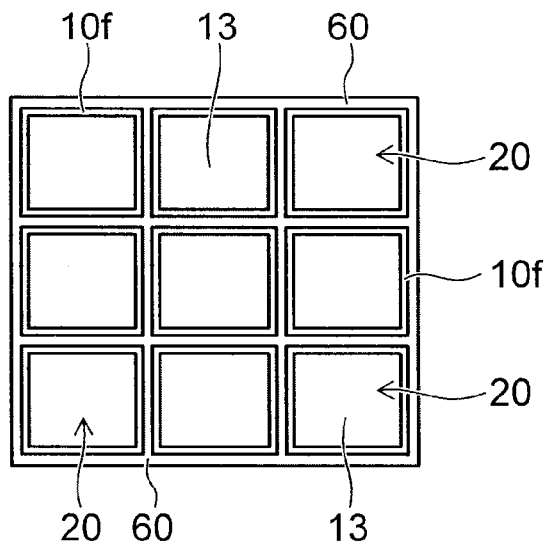

FIGS. 1A and 1B are schematic views showing an imaging device 1 according to an embodiment. FIG. 1A shows a partial cross-sectional view of the imaging device 1. FIG. 1B shows a cross-sectional view taken along line A-A shown in FIG. 1A.

The imaging device 1 includes a semiconductor layer 10, a plurality of pixels 20 provided in the semiconductor layer 10, and an electrode 30 that controls the output of the pixel 20. The semiconductor layer 10 is a silicon layer, for example, and the conductivity type thereof is the p-type. The pixel 20 detects light incident on the semiconductor layer 10.

As shown in FIG. 1A, the semiconductor layer 10 has a first surface 10a and a second surface 10b on the opposite side to the first surface. The electrode 30 that controls the output of each of the plurality of pixels 20 is provided on the first surface 10a. An insulating film 33 is provided between the semiconductor layer 10 and the electrode 30.

A first insulating film (hereinafter, an insulating film 40) and a second insulating film (hereinafter, an insulating film 41) are provided on the second surface 10b. The insulating film 41 is provided on the insulating film 40 in contact with the insulating film 40. The insulating film 41 has a smaller refractive index in the visible light range (for example, a wavelength range of 400 nm to 650 nm) than the insulating film 40.

The imaging device 1 further includes a light blocking film 60 that defines the boundary between adjacent ones of the plurality of pixels 20. The light blocking film 60 extends in the direction from the second surface 10b toward the first surface 10a. One end 60a of the light blocking film 60 is located at the same level as a surface of the insulating film 41 on the opposite side to the surface in contact with the insulating film 40, and the other end 60b is located in the semiconductor layer 10.

In the case where the insulating film 41 and a planarization film 51 provided on the insulating film 41 are made of the same material and are integrated together into an insulating film 50, one end 60a of the light blocking film 60 is located in the insulating film 50.

Next, the imaging device 1 is described in detail with reference to FIG. 1A and FIG. 1B. Although in the following description the p-type is taken as the conductivity type of the semiconductor layer 10, the embodiment is not limited thereto. That is, the semiconductor layer 10 may be the n-type.

As shown in FIG. 1A, a plurality of light receiving sections 13 are provided in the semiconductor layer 10. The conductivity type of the light receiving section 13 is the n-type different from that of the semiconductor layer 10. The light receiving section 13 absorbs light incident on the semiconductor layer 10, and generates a photocarrier.

As shown in FIG. 1B, each light receiving section 13 is surrounded by a pixel separation section 10f, and one pixel 20 includes one light receiving section 13. The pixel separation section 10f is a part of the semiconductor layer 10, and the conductivity type of the pixel separation section 10f is the p-type.

On the side of the first surface 10a of the semiconductor layer 10, a p$^+$ layer 19 (a first semiconductor region) is selectively provided in a portion corresponding to each individual pixel 20. The p$^+$ layer 19 contains a p-type impurity at a higher concentration than the semiconductor layer 10. An n$^+$ layer 17 (a second semiconductor region) is provided between the p$^+$ layer 19 and the light receiving section 13. The n$^+$ layer 17 contains an n-type impurity at a higher concentration than the light receiving section 13.

As shown in FIG. 1A, part of the n$^+$ layer 17 extends to the first surface 10a, and faces the electrode 30 across the insulating film 33. A p layer 15 is provided in a position adjacent to the extending portion 17a of the n$^+$ layer 17. The p layer 15 contains a p-type impurity at a higher concentration than the semiconductor layer 10 and at a lower concentration than the p$^+$ layer 19, for example. The p layer 15 faces the electrode 30 across the insulating film 33.

When a plus gate bias is applied to the electrode 30, an inversion channel is formed at the interface between the p layer 15 and the insulating film 33, for example. Photocarriers generated by photoelectric conversion in the light receiving section 13 are outputted as a photocurrent via the inversion channel and a not-shown source drain region.

On the other hand, on the side of the second surface 10b, the insulating film 40 and the insulating film 41 are provided on the semiconductor layer 10 via an insulating film 21. The insulating film 21 is a passivation film, and is provided directly on the semiconductor layer 10. The insulating film 21 is a silicon oxide film ($SiO_2$), for example.

As the insulating film 21, also a hafnium oxide ($HfO_2$) film or a stacked film of hafnium oxide and a silicon oxide film ($HfO_2/SiO_2$) may be used. Since these films have a fixed charge, the interface charge between the semiconductor layer 10 and the insulating film 21 can be controlled. Thereby, the dark current of the pixel 20 can be reduced, for example.

The insulating film 40 is a reflection prevention film provided on the insulating film 21. The refractive index of the insulating film 40 has a value between the refractive index of the semiconductor layer 10 and the refractive index of the insulating film 41 in the visible light range, for example. The insulating film 40 reduces the reflection of incident light between the insulating film 40 and the semiconductor layer 10.

When a silicon oxide film is used as the insulating film 41, the insulating film 40 includes at least one of silicon nitride (SiN), tantalum oxide (TaO), and titanium oxide (TiO), for example. The refractive index of the silicon oxide film is 1.5 (light wavelength: 633 nm). In contrast, the refractive index of the silicon nitride film is 1.8, the refractive index of the tantalum oxide film is 2.1, and the refractive index of the titanium oxide film is 2.6.

A single-layer film or a multiple-layer film may be used as the insulating film 40. The refractive index (or the equivalent refractive index) of the insulating film 40 is higher than the refractive index of the insulating film 41 provided directly on it.

As shown in FIG. 1A, color filters 53 and microlenses 55 are provided on the insulating film 41 via the planarization film 51. The planarization film 51 absorbs the unevenness of the surface of the insulating film 41. The refractive index of the planarization film 51 is smaller than the refractive index of the insulating film 40. A silicon oxide film may be used as the planarization film 51, for example.

The color filter and the microlens 55 are provided for each pixel. That is, the microlens 55 condenses light incident on each pixel, and causes the light to be incident on the light receiving section 13 with good efficiency. The color filter sorts the wavelength of incident light for each pixel.

The imaging device 1 further includes the light blocking film 60 that defines the boundary between pixels. The light blocking film 60 pierces through the insulating films 41, 40, and 21, and extends into the semiconductor layer 10.

As shown in FIG. 1B, the light blocking film 60 is provided in a lattice configuration in the pixel separation section 10f. The light blocking film 60 suppresses leakage to an adjacent pixel of light that has entered the pixel 20. That is, the light blocking film 60 absorbs or reflects the light that has entered the pixel 20.

An electrically conductive film may be used as the light blocking film 60, for example. For example, an electrically conductive film including at least one of silicon (Si), tungsten (W), and aluminum (Al) may be used.

The light blocking film 60 preferably has a high reflectance in the visible light range. Thereby, the light that has entered the light receiving section 13 can be increased to improve the light sensitivity of the pixel 20. From this point of view, aluminum is preferably used as the light blocking film 60, for example. Also a multiple-layer dielectric film that reflects visible light may be used as the light blocking film 60.

Next, a method for manufacturing the imaging device 1 is described with reference to FIG. 2A to FIG. 5. FIG. 2A to FIG. 5 are schematic cross-sectional views showing the manufacturing process of the imaging device 1 according to the embodiment.

First, a wafer 90 provided with a plurality of pixels and a circuit unit is prepared. The pixel 20 includes the light receiving section 13, the p layer 15, the n$^+$ layer 17, and the p$^+$ layer 19. The insulating film 33 and the electrode 30, which are parts of the circuit unit, are provided on the first surface 10a of the semiconductor layer 10. The circuit unit is covered with and protected by an insulating film 37.

On the other hand, the insulating films 21, 40, and 41 are sequentially stacked on the second surface 10b of the semiconductor layer 10. The refractive index in the visible light range of the insulating film 41 is smaller than the refractive index in the same range of the insulating film 40. A silicon nitride film is formed as the insulating film 40, and a silicon oxide film is formed thereon as the insulating film 41, for example. The insulating film 40 may be also a tantalum oxide film or a titanium oxide film. These insulating films may be formed using the sputtering method, for example.

Figure 2A:
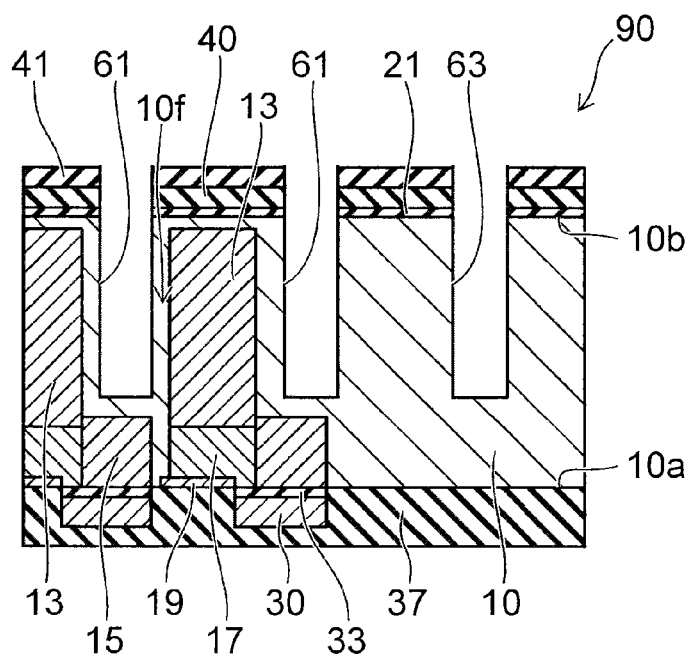
FIG. 2A to FIG. 5 are schematic cross-sectional views showing the manufacturing process of the imaging device according to the embodiment.

Next, as shown in FIG. 2A, a trench 61 that defines the boundary between adjacent ones of the plurality of pixels 20 is formed. Specifically, a not-shown etching mask is formed on the side of the second surface 10b of the semiconductor layer 10, and the RIE method is used to selectively etch the insulating films 41, 40, and 21 and the semiconductor layer 10. A hard mask including a silicon oxide film with a thickness of 200 nanometers (nm) and a silicon nitride film with a thickness of 50 nm may be used as the etching mask, for example.

The trench 61 is formed in the direction from the first surface 10b toward the first surface 10a; and pierces through the insulating film 41, the insulating film 40, and the insulating film 21 and extends into the semiconductor layer 10. The trench 61 is provided in the pixel separation section 10f between adjacent light receiving sections 13. A contact trench 63 is formed on the outside of a pixel unit 80 (see FIG. 5) in which the plurality of pixels 20 are provided. The contact trench 63 is communicated with the trench 61 in a not-shown portion.

Figure 2B:
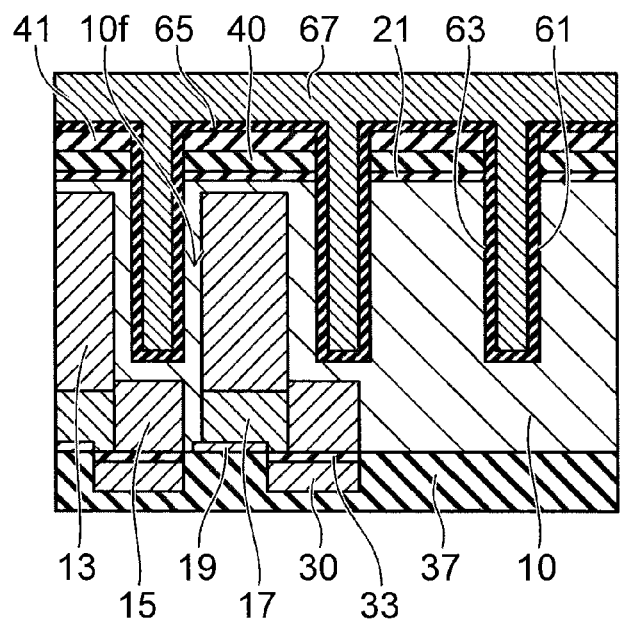

Next, as shown in FIG. 2B, an insulating film 65 (a third insulating film) that covers the interiors of the trenches 61 and 63 and the upper surface of the insulating film 41 is formed. For example, the ALD (atomic layer deposition) method is used to form a silicon oxide film with a thickness of approximately 10 nm.

A conductive layer 67 that fills the interiors of the trenches 61 and 63 and covers the side of the second surface 10b of the semiconductor layer 10 is formed on the insulating film 65. The conductive layer 67 includes tungsten (W), for example.

The conductive layer 67 is not limited to a single layer but may be multiple layers. For example, the conductive layer 67 may be a multiple-layer structure including a titanium nitride (TiN) layer with a thickness of 5 nm formed on the insulating film 65 and a tungsten layer formed on the titanium nitride layer. The tungsten layer may be formed using the CVD (Chemical Vapor Deposition) method, for example.

Figure 3A:
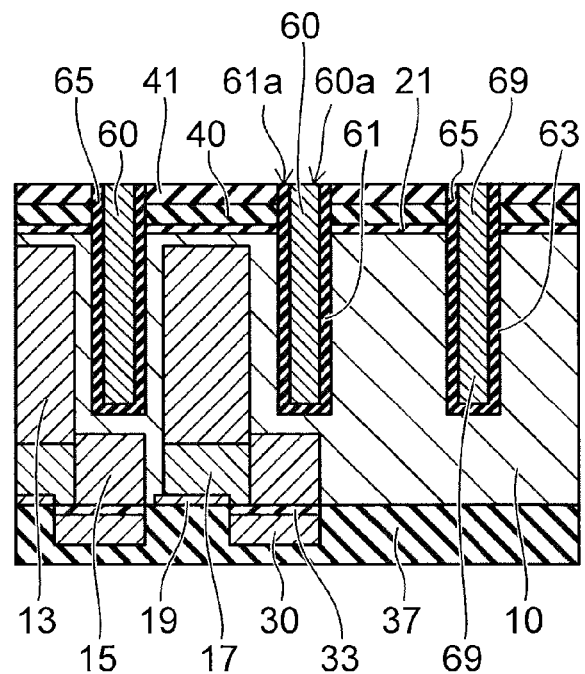

Next, as shown in FIG. 3A, the conductive layer 67 covering the side of the second surface 10b of the semiconductor layer 10 is removed while the portions filling the interiors of the trenches 61 and 63 are left. For example, the CMP (Chemical Mechanical Polishing) method is used to grind the side of the second surface 10b of the semiconductor layer 10. Thereby, the conductive layer 67 covering the second surface 10b can be removed.

In the process mentioned above, the conditions of CMP are set so that, after the conductive layer 67 is removed, grinding stops at the insulating film 41 or the grinding rate of the insulating film 41 becomes slow, for example. That is, after the grinding, the insulating film 41 is left on the insulating film 40. Consequently, in the process of removing the conductive layer 67, the insulating film 40 is prevented from being ground and experiencing a change in its film thickness. By maintaining the film thickness of the insulating film 40, which is a reflection prevention film, the sensitivity reduction of the pixel 20 can be suppressed.

As shown in FIG. 3A, the light blocking film 60 is formed in the trench 61. A contact section 69 is formed in the contact trench 63. An end 60a of the light blocking film 60 on the side of the opening 61a of the trench 61 is located at the same level as a surface of the insulating film 41 on the opposite side to the surface in contact with the insulating film 40.

In view of the in-wafer-plane distribution of grinding amounts of CMP, the thickness of the insulating film 41 after the grinding is preferably made 50 nanometers (nm) or more, for example. Thereby, grinding of the insulating film 40 can be avoided. That is, it is preferable that the spacing between the end 60a of the light blocking film 60 and the upper surface of the insulating film 40 (the interface between the insulating film 40 and the insulating film 41) be set to 50 nm or more.

Figure 3B:
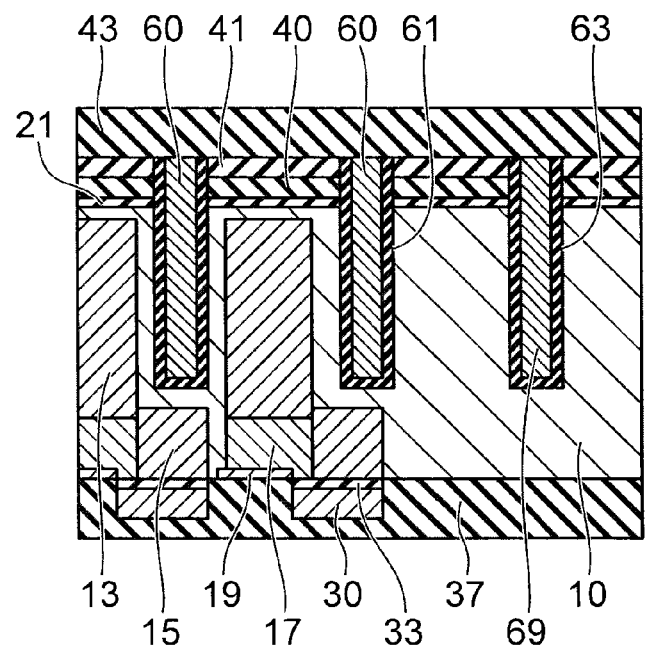

Next, as shown in FIG. 3B, an insulating film 43 is formed on the insulating film 41 and the light blocking film 60. The insulating film 43 is a silicon oxide film with a thickness of approximately 300 nm, for example.

Figure 4A:
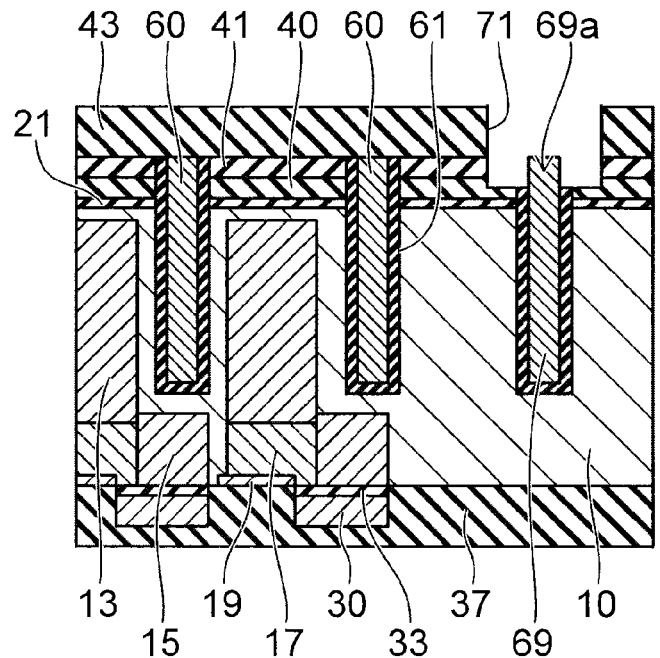

Subsequently, as shown in FIG. 4A, an opening 71 that extends from the upper surface of the insulating film 43 to the contact section 69 is formed. The insulating film 43 and the insulating film 41 are etched to expose an end portion 69a of the contact section 69 at the bottom surface of the opening 71, for example.

Over-etching of 40% with respect to the film thickness of the insulating film 43 of 300 nm is performed, for example. As a result, the insulating film 41 remaining on the insulating film 40 after the CMP is removed by the etching, and the underlying insulating film 40 is exposed. Also part of the insulating film 40 is etched, but the insulating film 40 is not completely removed because the initial film thickness thereof is 50 nm, for example.

Figure 4B:
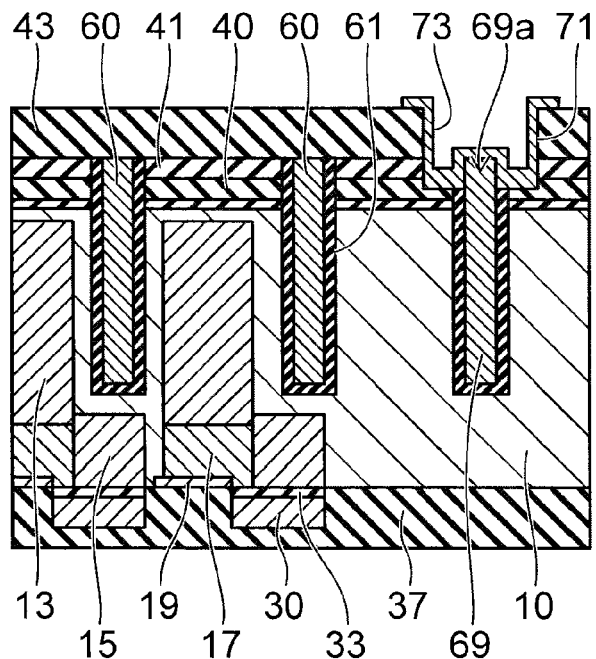

Next, as shown in FIG. 4B, an interconnection 73 that covers the inner surface of the opening 71 is formed to obtain electrical connection to the contact section 69. The interconnection 73 is an aluminum interconnection, and makes electrical connection between the contact section 69 and a not-shown control circuit, for example.

The light blocking film 60 and the contact section 69 are formed in the trenches 61 and 63 communicated with each other. Therefore, the light blocking film 60 and the contact section 69 are electrically connected. That is, a control bias can be applied to the light blocking film 60 via the interconnection 73 and the contact section 69. By setting the light blocking film 60 at a minus potential with respect to the pixel 20, the dark current of each pixel 20 can be reduced, for example.

Although in this example the contact section 69 electrically connected to the light blocking film 60 is formed, the embodiment is not limited thereto. For example, the contact section 69 may not be provided in the case where a $p^+$ layer with a high impurity concentration is used as the pixel separation section 10f (in the case where the impurity concentration of the semiconductor layer 10 is high, or in the case where a high concentration p-type impurity is formed by ion implantation).

Figure 5:
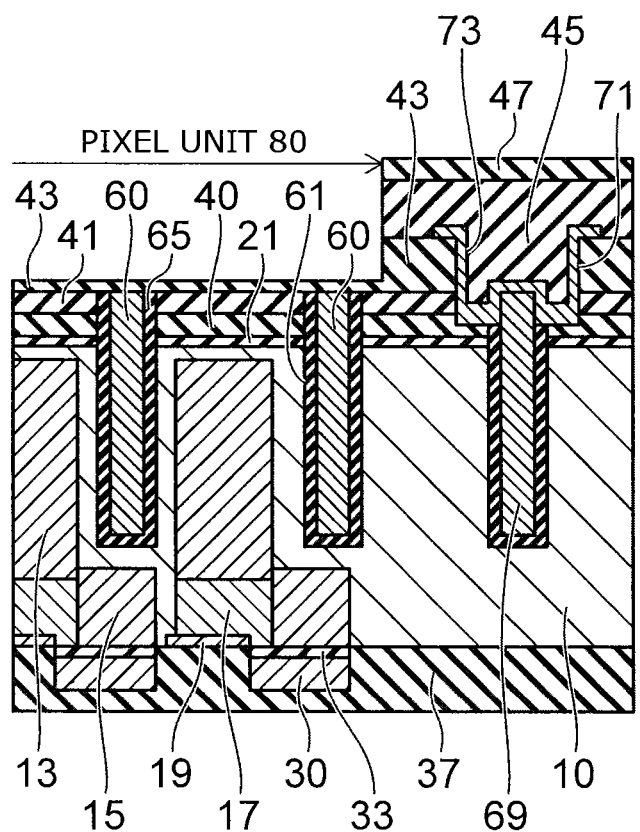

Next, as shown in FIG. 5, an insulating film 45 is formed on the insulating film 43. As shown in the drawing, the insulating film 45 is also buried in the opening 71, and covers the interconnection 73. An insulating film 47 is formed on the insulating film 45. The insulating film 45 is a silicon oxide film, for example, and the insulating film 47 is a silicon nitride film, for example. The insulating film 43 and the insulating film 45 function as an interlayer insulating film, for example.

Subsequently, in the pixel unit 80 in which the plurality of pixels 20 are provided, the insulating film 47, the insulating film 45, and the insulating film 43 are removed. At this time, the insulating film 43 is preferably etched so that a silicon oxide film with a smaller refractive index than the insulating film 40 is left 50 nm or more on the insulating film 40, for example.

If the insulating film 43 is completely removed, the light blocking film 60 is exposed, for example. Then, in a process such as ashing, a metal included in the light blocking film 60 may be oxidized abnormally to cubically expand. If the insulating film 41 is over-etched in the process of removing the insulating film 43, also the insulating film 40, which is a reflection prevention film, is etched, and the film thickness thereof may be changed. As a result, the reflectance to incident light becomes higher, and the sensitivity of the pixel 20 is reduced.

Such sensitivity degradation of the pixel 20 appears more significantly in the case where a tantalum oxide film or a titanium oxide film is used as the insulating film 40 than in the case where a silicon nitride film is used as it. That is, the difference between the etching rate of the tantalum oxide film and the titanium oxide film and the etching rate of the silicon oxide film is smaller than the difference between the etching rate of the silicon nitride film and the etching rate of the silicon oxide film. Therefore, in the case where a tantalum oxide film or a titanium oxide film is used as the insulating film 40, the effect of the silicon oxide film left on the insulating film 40 is more significant.

On the other hand, the variation of the silicon oxide film left on the insulating film 40 may influence the sensitivity of the pixel 20. However, the influence of the variation of the silicon oxide film is much smaller than the influence of the film thickness change of the insulating film 40 on the sensitivity of the pixel 20.

Thus, in the pixel unit 80, when removing the insulating film 47, the insulating film 45, and the insulating film 43, it is preferable that a film with a lower refractive index than the insulating film 40 be left with a thickness of 50 nm or more on the insulating film 40.

Subsequently, the planarization film 51, the color filter 53, and the microlens 55 are sequentially formed on the pixel unit 80; thus, the imaging device 1 is completed.

Thereby, the imaging device 1 can be obtained that includes the light blocking film 60 for preventing color mixing between adjacent pixels and suppresses the variation in the light sensitivity of each pixel 20.

In the structure mentioned above, the insulating film 41, the insulating film 43, and the planarization film 51 may be formed so as to include the same material with a lower refractive index in the visible light range than the insulating film 40, for example. These are integrated together to be provided as the insulating film 50 in the end. Consequently, one end of the light blocking film 60 is located in the insulating film 50 provided on the insulating film 40.

Figure 6A:
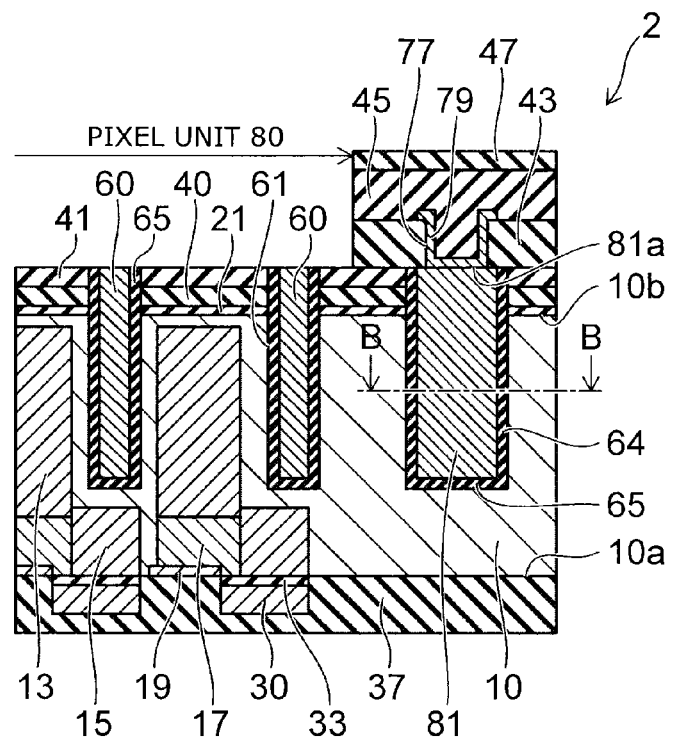
FIGS. 6A to 6C are schematic cross-sectional views showing an imaging device according to a variation of the embodiment.
Figure 6B:
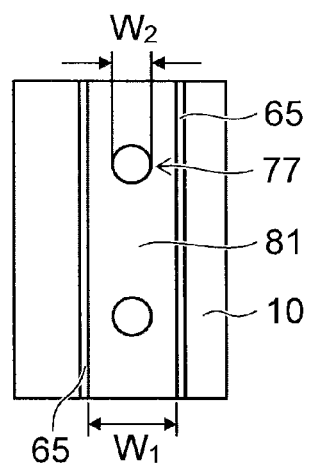
Figure 6C:
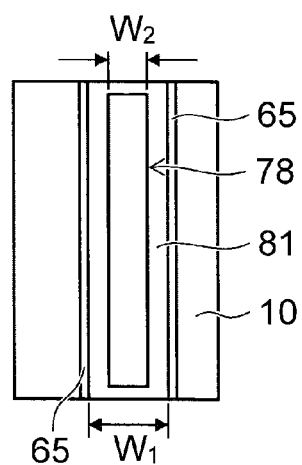

FIGS. 6A to 6C are schematic cross-sectional views showing an imaging device 2 according to a variation of the embodiment. FIG. 6A is a schematic view showing a partial cross-sectional view of the imaging device 2. FIG. 6B is a cross-sectional view taken along line B-B shown in FIG. 6A. In FIG. 6A, the planarization film 51, the color filter 53, and the microlens 55 are omitted.

As shown in FIG. 6A, the imaging device 2 includes the semiconductor layer 10, a plurality of pixels 20 provided in the semiconductor layer 10, and the electrode 30 that is provided on the side of the first surface 10a of the semiconductor layer 10 and controls the output of the pixel 20. The insulating film 40 and the insulating film 41 are provided on the second surface 10b on the opposite side to the first surface 10a. The insulating film 41 is provided on the insulating film 40 in contact with the insulating film 40. The insulating film 41 has a smaller refractive index in the visible light range (for example, a wavelength range of 400 nm to 650 nm) than the insulating film 40.

The imaging device 2 further includes the light blocking film 60 that defines the boundary between adjacent ones of the plurality of pixels 20 and a contact section 81 for the light blocking film 60.

The light blocking film 60 is provided in the trench 61 extending in the direction from the second surface 10b toward the first surface 10a. One end 60a of the light blocking film 60 is located at the same level as a surface of the insulating film 41 on the opposite side to the surface in contact with the insulating film 40, or is located in the insulating film 50 including the insulating film 41 (see FIG. 1), and the other end 60b is located in the semiconductor layer 10.

On the other hand, the contact section 81 is provided in a contact trench 64 communicated with the trench 61. The width of the contact trench 64 is wider than the width of the trench 61 defining the boundary between pixels 20.

The contact section 81 has a contact surface 81a parallel to the second surface 10b. An interconnection 79 provided in contact with the contact section 81 is in contact with the contact section 81 on the inside of the outer edge of the contact surface 81a.

FIG. 6B and FIG. 6C show relationships between the contact section 81 and openings 77 and 78 provided in the insulating film 43. The interconnection 79 provided in the opening 77 and the opening 78 is in contact with the contact section 81 at its bottom surface.

As shown in FIG. 6B, the opening 77 is a circular shape. On the other hand, the opening 78 shown in FIG. 6C is a rectangular shape. The shape of the opening is arbitrary, and either may be used. It is preferable that a plurality of openings be provided in order to prevent defective conduction between the contact section 81 and the interconnection 79 due to defective processing during the opening formation.

The openings 77 and 78 are provided so as to lead to the inside of the outer edge of the contact surface 81a. That is, the width $W_1$ of the contact section 81 is wider than the width $W_2$ of the openings 77 and 78. The difference between $W_1$ and $W_2$ is preferably set with consideration of misalignment in photolithography, for example. That is, the dimensions of $W_1$ and $W_2$ are set so that the insulating film 40 and the insulating film 21 are not exposed at the bottom surfaces of the openings 77 and 78. The misalignments of a KrF stepper and an ArF stepper are approximately 40 nm and 25 nm, respectively, for example. Thus, the difference between $W_1$ and $W_2$ may be set to 80 nm or more in the case of using a KrF stepper, and may be set to 50 nm or more in the case of using an ArF stepper, for example.

In the example shown in FIG. 5, the width of the opening 71 is wider than the contact section 69. Therefore, if the insulating film 43 is over-etched in the process of forming the opening 71, the insulating film 40 and the insulating film 21 may be removed to expose the semiconductor layer 10. The interconnection 73 comes into contact with the semiconductor layer 10 at the bottom surface of the opening 71, and all the pixels 20 become the same potential. As a result, separation between pixels 20 cannot be made, and the imaging device may not operate normally.

In contrast, only the contact section 81 is exposed at the bottom surfaces of the openings 77 and 78. Therefore, even if the insulating film 43 is over-etched, there is no case where the insulating film 40 and the insulating film 21 are etched, and there is no fear that the semiconductor layer 10 will be exposed. Thus, the etching time when the openings 77 and 78 are opened can be set long, and the incidence of bad contacts due to non-opening can be reduced, for example. Furthermore, also another opening that requires long time etching can be simultaneously formed during the formation of the openings 77 and 78. Thereby, the manufacturing process can be simplified, and the number of processes and the manufacturing costs can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An imaging device comprising:
   a semiconductor layer of a first conductivity type having a first surface and a second surface on an opposite side to the first surface, the semiconductor layer including a plurality of pixels configured to detect light incident from a side of the second surface;
   an electrode provided on the first surface and configured to control an output of each of the pixels;
   a first insulating film provided on the second surface;

a second insulating film provided on the first insulating film in contact with the first insulating film and having a smaller refractive index in a visible light range than the first insulating film;

a light blocking film defining a boundary between adjacent ones of the pixels, one end of the light blocking film being located in the second insulating film or at a same level as a surface of the second insulating film on an opposite side to a surface in contact with the first insulating film, another end of the light blocking film being located in the semiconductor layer, and a contact section provided in the semiconductor layer and electrically connected to the light blocking film, the contact section extending through the second surface.

2. The imaging device according to claim 1, including a reflection prevention film provided on the first surface and including the first insulating film.

3. The imaging device according to claim 1, wherein a refractive index of the first insulating film has a value between a refractive index of the semiconductor layer and a refractive index of the second insulating film.

4. The imaging device according to claim 1, wherein a spacing between the one end and the first insulating film is 50 nanometers or more.

5. The imaging device according to claim 1, wherein the first insulating film includes at least one of silicon nitride (SiN), tantalum oxide (TaO), and titanium oxide (TiO).

6. The imaging device according to claim 1, wherein
the first insulating film includes at least one of silicon nitride (SiN), tantalum oxide (TaO), and titanium oxide (TiO) and
the second insulating film is a silicon oxide film.

7. The imaging device according to claim 1, wherein the first insulating film has a multiple-layer structure and an equivalent refractive index of the first insulating film is larger than a refractive index of the second insulating film.

8. The imaging device according to claim 1, further comprising a passivation film provided between the semiconductor layer and the first insulating film.

9. The imaging device according to claim 8, wherein the passivation film includes at least one of a silicon oxide film and a hafnium oxide film.

10. The imaging device according to claim 1, further comprising a planarization film provided on the second insulating film.

11. The imaging device according to claim 10, further comprising a color filter provided on the planarization film and a microlens provided on the color filter.

12. The imaging device according to claim 11, wherein the microlens is provided for each of the pixels.

13. The imaging device according to claim 1, wherein
the semiconductor layer includes a light receiving section corresponding to each of the pixels and a pixel separation section surrounding the light receiving section and
the light receiving section has a second conductivity type different from the first conductivity type and the pixel separation section has the first conductivity type.

14. The imaging device according to claim 13, wherein
the semiconductor layer has a first semiconductor region of the first conductivity type selectively provided on a side of the first surface in a portion corresponding to the pixels and
the first semiconductor region contains an impurity of the first conductivity type at a higher concentration than the pixel separation section.

15. The imaging device according to claim 13, wherein
the semiconductor layer has a second semiconductor region of a second conductivity type between the first semiconductor region and the light receiving section and
the second semiconductor region contains an impurity of the second conductivity type at a higher concentration than the light receiving section.

16. The imaging device according to claim 13, wherein the light blocking film is provided in the pixel separation section.

17. The imaging device according to claim 1, wherein the light blocking film has electrical conductivity and includes at least one of silicon, tungsten, and aluminum (Al).

18. The imaging device according to claim 1, further comprising:
an interconnection provided on the second surface side and electrically connected to the contact section,
wherein the contact section has an end portion protruding from the second surface, and the interconnection covers the end portion.

19. The imaging device according to claim 1, further comprising:
an interconnection provided on the second surface side and electrically connected to the contact section,
wherein the contact section has an end face on the second surface side, and the interconnection is in contact with the end face.

* * * * *